United States Patent [19]
Hwang

[11] Patent Number: 5,251,174
[45] Date of Patent: Oct. 5, 1993

[54] MEMORY SYSTEM
[75] Inventor: Ching-Tung Hwang, Lungtan, Taiwan
[73] Assignee: Acer Incorporated, Taipei, Taiwan
[21] Appl. No.: 898,040
[22] Filed: Jun. 12, 1992
[51] Int. Cl.[5] ............................................. G11C 13/00
[52] U.S. Cl. .................................... 365/200; 365/193; 365/230.08; 391/10.1; 391/10.2
[58] Field of Search ................... 365/200, 193, 230.08; 371/10.1, 10.2, 11.1

[56] References Cited
U.S. PATENT DOCUMENTS

| | | | |
|---|---|---|---|
| 3,913,072 | 10/1975 | Caft ................................. | 365/200 X |
| 3,969,706 | 7/1976 | Proebsting et al. ............. | 365/193 X |
| 4,128,900 | 12/1978 | Lappington ................ | 365/230.08 X |
| 4,725,945 | 2/1988 | Kronstadt et al. ......... | 365/230.08 X |
| 5,058,064 | 10/1991 | Hahm et al. ............... | 365/230.08 X |

Primary Examiner—Eugene R. LaRoche
Assistant Examiner—Do Hyun Yoo
Attorney, Agent, or Firm—Kenneth M. Kaslow

[57] ABSTRACT

A memory system capable of incorporating defective memory chips is provided. The system includes a first memory chip having a first data signal line and being logically divided into an upper half and a lower half, a controlling circuit responsive to a first indicative address signal and an address strobe signal for outputting therefrom a second indicative address signal and a first and a second output enabling signals, and a second memory chip being logically divided into an upper and a lower halves and having a second data signal line electrically connected to the first data signal line so that only one of the first and second chips is accessible at any time.

7 Claims, 3 Drawing Sheets

MEMORY SYSTEM

BACKGROUND OF THE INVENTION

The present invention relates to a memory system, and more particularly to one making use of defective memory chips. After being manufactured, it is not unusual to find a memory chip, e.g. a DRAM chip, to be defective only in the logically upper (or lower) half thereof. As an example, a DRAM chip made by TI has a logical upper and a logical lower halves, each of which is accessible depending on the value of specific address bit at the negative-going edge of row address strobe (RAS) signal. It will be of a great saving if all of half defective memory chips are used in a computer memory system instead of being discarded.

It has been known in a most conventional system to utilize the defective memory chips in a mutually complementary manner which means combining a chip defective only in its upper half with another chip defective only in its lower half can logically constitute a perfect memory chip. If the chip manufacturer, however, finds out the defective chips are defective, for the most cases, in their upper (or lower) halves, the above-mentioned mutually complementary arrangement will be no more applicable.

SUMMARY OF THE INVENTION

It is therefore an object of the present invention to provide a memory system capable of effectively making use of two memory chips each of which is defective in either one of the logically upper or lower halves.

It is further an object of the present invention to provide a memory system with a reduced cost by utilizing two defective memory chips.

According to the present invention, a memory system, to be electrically connected to a memory controller capable of providing to the memory system an address strobe signal and a plurality of memory address signals including a first indicative address signal, includes a first memory chip having a first data signal line and a first input terminal and being logically divided into a first upper part and a first lower part each of which is accessible depending on the value of the first indicative address signal, a controlling circuit responsive to the first indicative address signal and the address strobe signal for outputting a second indicative address signal, a first output enabling signal to the first input terminal and a second output enabling signal, and a second memory chip being logically divided into a second upper part and a second lower part each of which is accessible depending on the value of the second indicative address signal and having a second input terminal for receiving the second output enabling signal and a second data signal line electrically connected to the first data signal line so that only one of the first and second chips is accessible at any time.

Certainly, the memory combination of the present invention can be, 1) a first memory chip with defective upper part and a second memory chip with defective upper part, 2) a first memory chip with defective upper part and a second memory chip with defective lower part, or 3) a first memory chip with defective lower part and a second memory chip with defective lower part.

Certainly, the address strobe signal can be a row or a column address strobe signal.

Certainly, the controlling device can include a first switch, a D-type flip-flop having a data input selectively electrically connected to the first indicative address signal and an inverting signal thereof, a clock input inputting an inverting signal of the address strobe signal, a first output terminal ($\overline{Q}$) outputting the first output enabling signal, and a second output terminal (Q) outputting the second output enabling signal, and a second switch for selectively inputting the first indicative address signal and an inverting signal thereof to output the second indicative address signal.

The present invention may best be understood through the following descriptions with reference to the accompanying drawings, in which:

DETAILED DESCRIPTION OF THE PREFERRED EMBODIMENT

Figure 1:
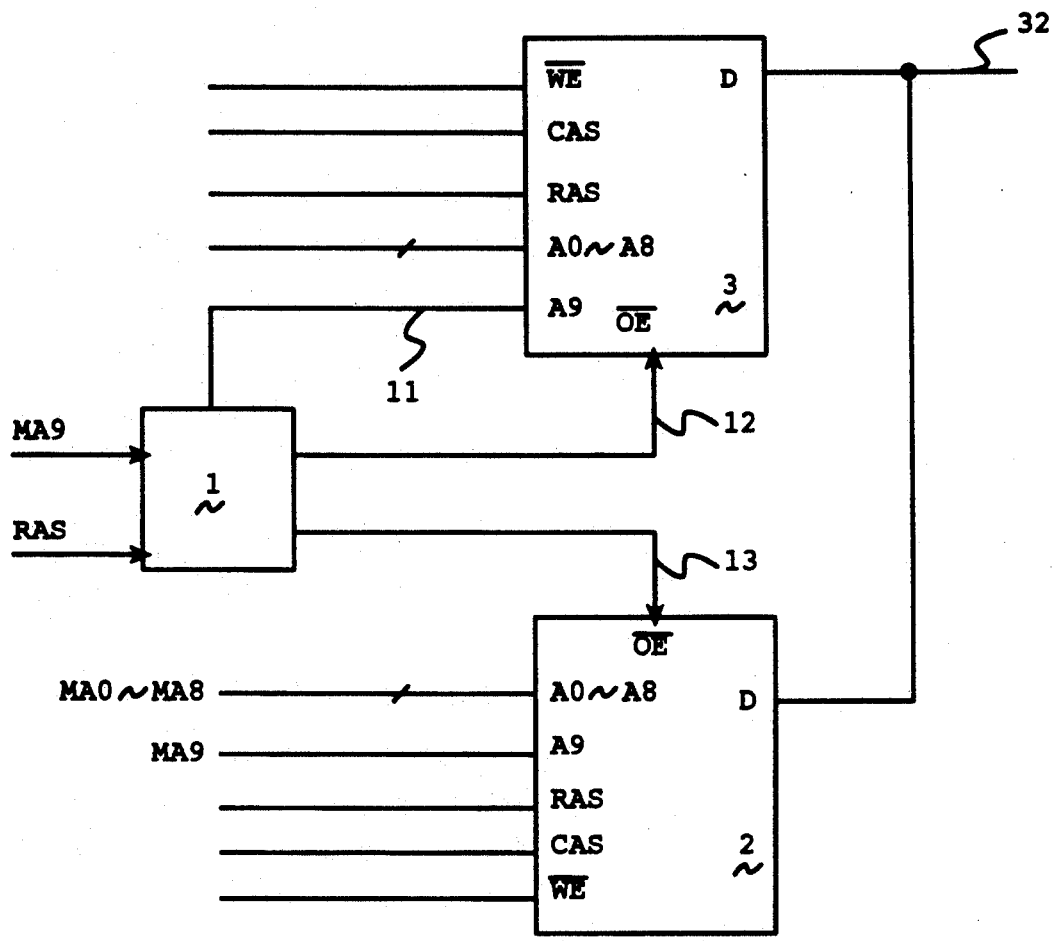
FIG. 1 is a block diagram showing a preferred embodiment of a memory system according to the present invention.

Referring now to FIG. 1, a preferred embodiment of a memory system of the present invention, being electrically connected to a memory controller (not shown) capable of providing to the present memory system a plurality of memory address signals (MA0–MA9), a row address strobe signal (RAS), a column strobe signal (CAS) and a write enabling signal ($\overline{WE}$), includes a first memory chip 2 having a first data signal line, a controlling circuit 1 and a second memory chip 3 having a second data signal line connected with the first data signal line of chip 2 to serve as a data signal line 32 of the present memory system.

Row and column address strobe signals (RAS, CAS) serve as latching signals so that when row address strobe signal is high the row address value will be latched into the memory chip, and when row and column address strobing signals (RAS, CAS) are respectively low and high the column address value will be latched into the memory chip, wherein the latched row and column address value will determine the accessed memory location.

The memory indicative address signal MA9 to the input terminal A9 will determine which one of the logically upper and lower halves of the memory chip is accessed. When memory chip 2 or 3 is enabled through its input terminal ($\overline{OE}$), it can output from its output terminal (D) an output value through signal line 32.

Controlling circuit 1 inputs indicative address signal MA9 and row address strobe signal (RAS) and outputs to second memory chip 3 an indicative address signal 11 and an output enabling signal 12 and outputs to first memory chip 2 an output enabling signal 13. Only one of first and second memory chips 2,3 is accessible at any time.

Figure 2:
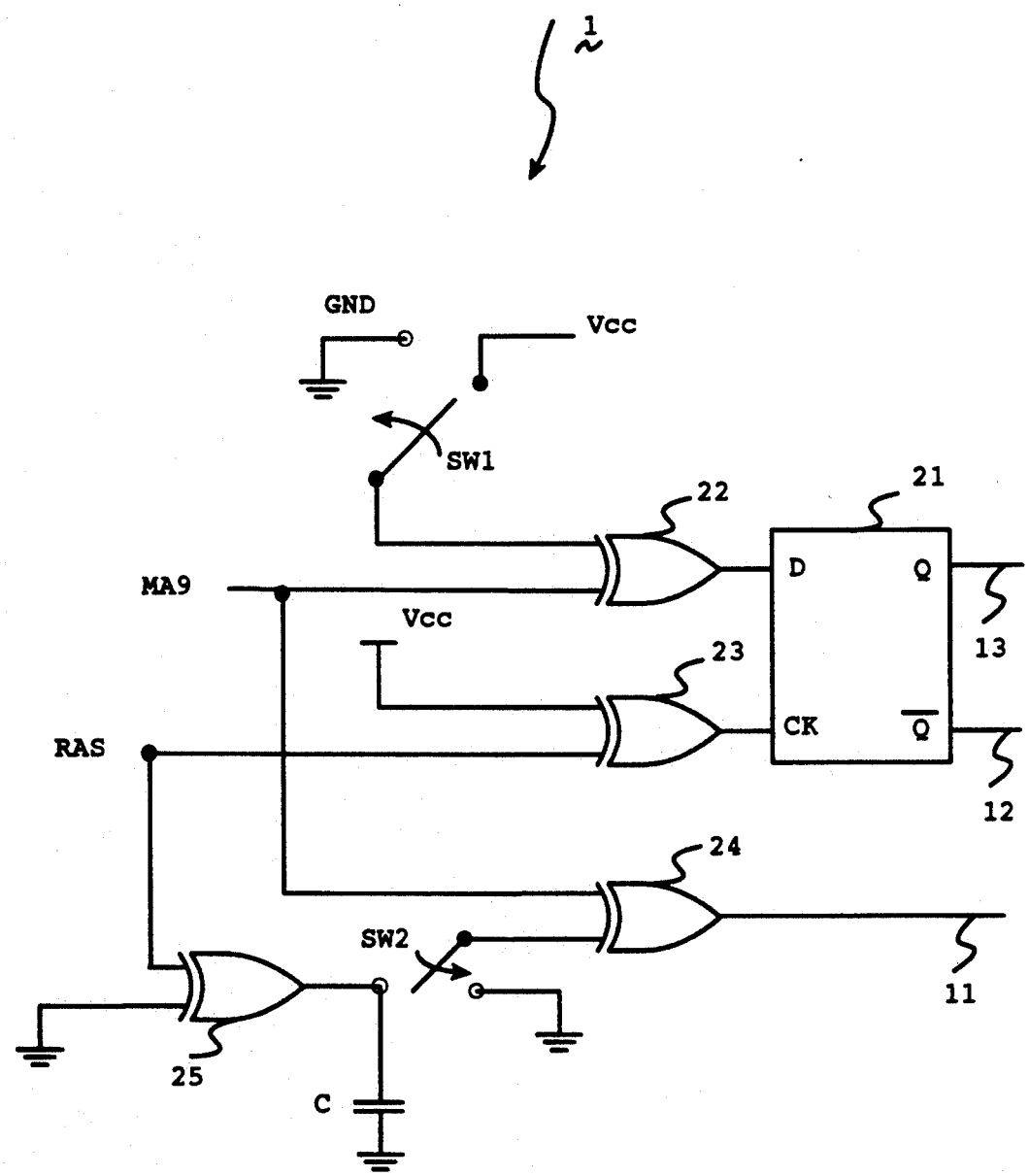
FIG. 2 is a diagram showing a preferred embodiment of a controlling circuit of the memory system in FIG. 1.

As shown in FIG. 2, a preferred embodiment of controlling circuit 1 includes a D-type flip-flop 21, two switches SW1, SW2 and 4 exclusive OR gates 22, 23, 24, 25. The movable end of switch SW1 can be electrically connected to the power supply (VCC) or the ground (GND), whereas the movable end of switch SW2 can be electrically connected to the ground (GND) or the output terminal of exclusive OR gate 25. The data input (D) of flip-flop 21 is connected to the output terminal of exclusive OR gate 22 having a first input terminal connected to the common end of switch SW1 and a second input terminal inputting therein indicative address signal MA9. The clock input (CK) of flip-flop 21 is connected to the output of exclusive OR gate 23 having a first input terminal connected to power supply (VCC) and a second input terminal inputting therein row address strobe signal (RAS). The output terminals (Q,$\overline{Q}$) of flip-flop 21 respectively output therefrom output enabling signals 13, 12. Exclusive OR gate 24 has a first input terminal inputting therein indicative address signal MA9, a second input terminal connected to the common end of switch SW2 and an output terminal outputting therefrom indicative address signal 11. Exclusive OR gate 25 has a first input terminal inputting therein row address strobe signal (RAS), a second input terminal connected to the ground (GND) and an output terminal connected to the movable end of switch SW2.

If the present system is to be used with mutually complementary defective memory chips, switch SW2 of controlling circuit 1 must be grounded (SW2=GND). Thus, if memory chip 3 has a perfect upper half, memory chip 2 has a perfect lower half, the movable end of switch SW1 is switched to the power supply (SW1=VCC). The present memory system will logically look like a perfect memory chip viewed from the outside of the memory system.

If the present system is to be used with two memory chips both having defective upper or lower halves, switch SW2 of controlling circuit 1 must be switched to the output end of exclusive OR gate 25. If memory chips 2,3 both have perfect upper halves, then switch SW1 is switched to the power supply (VCC). Chip 3 will be disabled and chip 2 will be enabled when row address strobe signal (RAS) and indicative address signal MA9 are high. Chip 3 will be enabled and chip 2 will be disabled when row address strobe signal (RAS) is high and indicative address signal MA9 is low. So that, from a logical viewpoint, memory chips 2, 3, are respectively upper and lower halves of a perfect memory chip.

If memory chips 2, 3 both have perfect lower halves, then switch SW1 is switched to ground. Chip 3 will be enabled and chip 2 will be disabled when row address strobe signal (RAS) is high and address signal MA9 is low, and chip 3 will be disabled and chip 2 will be enabled when row address strobe signal (RAS) and address signal MA9 are high. So that, from a logical viewpoint, chips 2, 3, are respectively lower and upper halves of a perfect memory chip.

Figure 3:
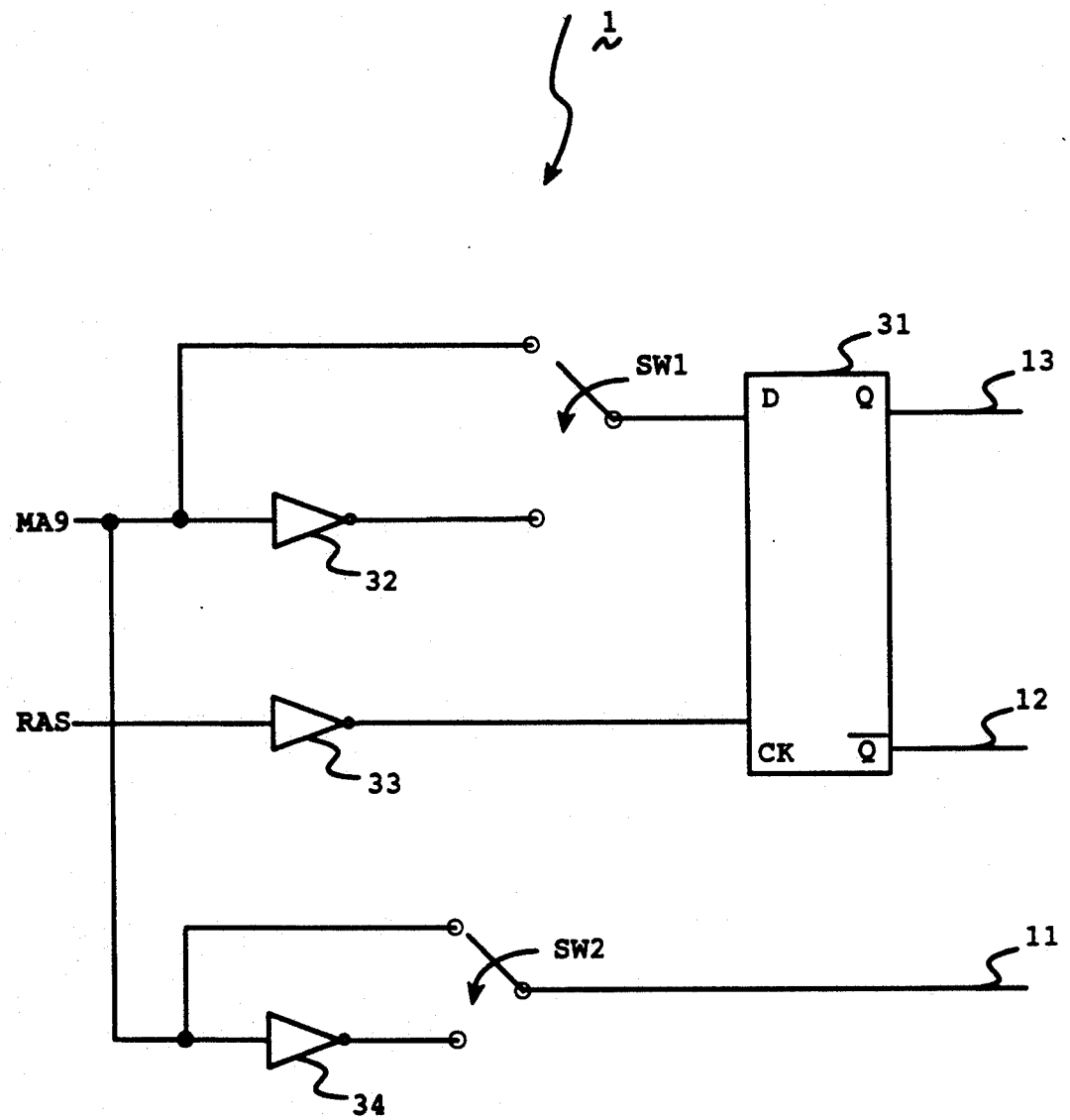
FIG. 3 is a diagram showing another preferred embodiment of a controlling circuit of the memory system in FIG. 1.

FIG. 3 shows another preferred embodiment of controlling circuit 1 which includes a D-type flip-flop 31, 3 inverters 32, 33, 34 and two switches SW1 and SW2. If the present system is to be used with two mutually complementary defective memory chips, switch SW2 should be upwardly switched, whereas if used with two memory chips both having the same defective half, switch SW2 must be downwardly switched. Since the operating principle of this embodiment is very similar to that of the previous embodiment, further description is considered not necessary.

The above described embodiments are merely illustrative so that modifications capable of being made thereto by those skilled in the art are considered to fall into the scope of the appended claims which is to be broadly interpreted.

As an example, which one of the upper and lower halves of a memory chip is accessed is controlled by address signal MA9 in the disclosed embodiments. It is to be noticed that other address signal can also be alternatively used therefor without departing from the spirit of the present invention.

Also, row address strobe signal (RAS) serves as the input signal for controlling circuit 1 in the disclosed embodiments, other strobe signal, e.g. column address strobe signal (CAS), however, can be used as the input signal therefor without departing from the spirit of the present invention.

What we claim is:

1. A memory system adapted to be electrically connected to a memory controller capable of providing to said memory system an address strobe signal and a plurality of memory address signals including a first indicative address signal, comprising:

a first memory chip having a first data signal line and a first input terminal, and being logically divided into a first upper part and a first lower part each of which is accessible depending on the value of said first indicative address signal;

a controlling circuit responsive to said first indicative address signal and said address strobe signal for outputting a second indicative address signal, a first output enabling signal to said first input terminal, and a second output enabling signal; and a second memory chip being logically divided into a second upper part and a second lower part each of which is accessible depending on the value of said second indicative address signal, and having a second input terminal for receiving said second output enabling signal and a second data signal line electrically connected to said first data signal line so that only one of said first and second memory chips is accessible at any time.

2. The memory system according to claim 1 wherein said first and second upper parts are defective and not accessed.

3. The memory system according to claim 1 wherein said first upper and said second lower parts are defective and not accessed.

4. The memory system according to claim 1 wherein said first and second lower parts are defective and not accessed.

5. The memory system according to claim 1 wherein said address strobe signal is a row address strobe signal.

6. The memory system according to claim 1 wherein said address strobe signal is a column address strobe signal.

7. The memory system according to claim 1 wherein said controlling circuit comprises:

a first switch;

a D-type flip-flop having a data input terminal selectively electrically connected by the first switch to said first indicative address signal and an inverting signal of said first indicative address signal, a clock input terminal inputting an inverting signal of said address strobe signal, a first output terminal (Q) outputting said first output enabling signal, and a second output terminal ($\overline{Q}$) outputting therefrom said second output enabling signal; and a second switch for selectively inputting said first indicative address signal and an inverting signal of said first indicative signal to output said second indicative address signal.

* * * * *